(12) United States Patent
Kang et al.

(10) Patent No.: US 9,975,774 B2
(45) Date of Patent: May 22, 2018

(54) CATALYST FOR SYNTHESIZING MULTI-WALL CARBON NANOTUBES, METHOD FOR PRODUCING CATALYST, AND MULTI-WALL CARBON NANOTUBES SYNTHESIZED BY CATALYST

(71) Applicant: JEIO CO., LTD., Incheon (KR)

(72) Inventors: Deuk Joo Kang, Incheon (KR); Ju Hee Kim, Siheung-si (KR); Ju Sik Kim, Siheung-si (KR)

(73) Assignee: JEIO CO., LTD., Incheon (KR)

( * ) Notice: Subject to any disclaimer, the term of this patent is extended or adjusted under 35 U.S.C. 154(b) by 0 days. days.

(21) Appl. No.: 15/110,737

(22) PCT Filed: Jan. 5, 2015

(86) PCT No.: PCT/KR2015/000053
§ 371 (c)(1),
(2) Date: Jul. 9, 2016

(87) PCT Pub. No.: WO2015/105302
PCT Pub. Date: Jul. 16, 2015

(65) Prior Publication Data
US 2016/0325998 A1    Nov. 10, 2016

(30) Foreign Application Priority Data

Jan. 9, 2014 (KR) .......................... 10-2014-0002743
Dec. 5, 2014 (KR) .......................... 10-2014-0174427

(51) Int. Cl.
*C01B 31/02* (2006.01)
*B01J 37/04* (2006.01)
(Continued)

(52) U.S. Cl.
CPC ........... *C01B 31/022* (2013.01); *B01J 21/185* (2013.01); *B01J 23/002* (2013.01); *B01J 23/78* (2013.01);
(Continued)

(58) Field of Classification Search
CPC ... C01B 31/022; C01B 31/0233; C01B 32/15; C01B 2202/06; C01B 2202/32;
(Continued)

(56) References Cited

U.S. PATENT DOCUMENTS

2010/0230642 A1* 9/2010 Kim ...................... B01J 23/002
                                                                252/511
2011/0195013 A1    8/2011 Bae et al.
2013/0207026 A1* 8/2013 Kim .................... C01B 31/0233
                                                                 252/71

FOREIGN PATENT DOCUMENTS

KR         2010/0042765 A    4/2010
KR    10-2010-0045247 A    5/2010
(Continued)

OTHER PUBLICATIONS

Lehman, et al., "Evaluating the characteristics of multiwall carbon nanotubes." Carbon 2011, vol. 49, pp. 2581-2602.

*Primary Examiner* — Richard M Rump
(74) *Attorney, Agent, or Firm* — Maschoff Brennan (57) ABSTRACT

The present invention relates to a catalyst for synthesizing multi-wall carbon nanotubes and, more specifically, to a catalyst for synthesizing multi-wall carbon nanotubes, capable of easily disperse the synthesized multi-wall carbon nanotubes and significantly improving conductivity, to a method for producing the catalyst, and to multi-wall carbon nanotubes synthesized by the catalyst.

6 Claims, 4 Drawing Sheets

(51) Int. Cl.
*B01J 37/08* (2006.01)
*H01L 31/0224* (2006.01)
*H01M 4/62* (2006.01)
*H01L 51/00* (2006.01)
*C01B 32/162* (2017.01)
*B01J 21/18* (2006.01)
*B01J 23/00* (2006.01)
*B01J 23/78* (2006.01)
*B01J 35/02* (2006.01)
*B01J 35/10* (2006.01)
*H01L 51/52* (2006.01)
*B82Y 30/00* (2011.01)
*B82Y 40/00* (2011.01)
*H01G 11/36* (2013.01)

(52) U.S. Cl.
CPC ......... *B01J 35/026* (2013.01); *B01J 35/1019* (2013.01); *B01J 35/1023* (2013.01); *B01J 37/04* (2013.01); *B01J 37/088* (2013.01); *C01B 32/162* (2017.08); *H01L 31/022466* (2013.01); *H01L 51/0048* (2013.01); *H01M 4/625* (2013.01); *B01J 2523/00* (2013.01); *B82Y 30/00* (2013.01); *B82Y 40/00* (2013.01); *C01B 2202/06* (2013.01); *C01B 2202/32* (2013.01); *C01B 2202/36* (2013.01); *H01G 11/36* (2013.01); *H01L 51/5203* (2013.01); *Y10S 977/752* (2013.01); *Y10S 977/843* (2013.01); *Y10S 977/948* (2013.01)

(58) Field of Classification Search
CPC .......... H01L 51/0048; H01L 31/022466; B01J 37/088; B01J 37/04; B01J 23/8872; B01J 23/34; B01J 35/02; H01G 11/36; Y10S 977/752; Y10S 977/843; Y10S 977/948; B82Y 30/00; H01M 4/625
See application file for complete search history.

(56) References Cited

FOREIGN PATENT DOCUMENTS

| KR | 10-1018660 B1 | 3/2011 |
| KR | 10-2012-0090108 A | 8/2012 |
| KR | 2012/0093458 A | 8/2012 |
| KR | 10-2013-0078855 A | 7/2013 |
| KR | 10-2013-0094364 A | 8/2013 |

* cited by examiner

CATALYST FOR SYNTHESIZING MULTI-WALL CARBON NANOTUBES, METHOD FOR PRODUCING CATALYST, AND MULTI-WALL CARBON NANOTUBES SYNTHESIZED BY CATALYST

BACKGROUND

Technical Field

The present invention relates to a catalyst for synthesizing multi-wall carbon nanotubes, and in particular to a catalyst for synthesizing multi-wall carbon nanotubes, a method for producing the catalyst, and multi-wall carbon nanotubes synthesized by the catalyst, which are able to allow an easier distribution of synthesized multi-wall carbon nanotubes and significantly improve conductivity.

Background Art

The carbon nanotube (CNT) is a kind of a carbon allotrope formed in a cylindrical tube structure wherein carbons are coupled into a hexagonal configuration. Since the CNT, in general, is formed in a tube shape the diameter of which is a couple of nm, it is called a nanotube. This nanotube is hollow and light and has a tensile strength which is 100 times, to the maximum, of a steel which has the same thickness as the nanotube and has a physical property which allows the CNT to bend 90°. For this reason, the CNT is receiving attention as a new material. Moreover, it has a high heat and electrical conductivity and provides the characteristics of a conductor and a semiconductor which are determined based on the angle where carbon layers are wound. Furthermore, the carbon nanotube may be classified into a single walled carbon nanotube (SWNT) and a multi-walled carbon nanotube (MWNT).

The carbon nanotube, in general, may be produced by any of an electric discharge method, a laser deposition method, a plasma chemical vapor deposition method, a thermo-chemical deposition method, a vapor synthesis method, an electrolysis method, etc., among which the aforementioned vapor synthesis method is receiving the biggest attention since the deposit of a carbon nanotube can be formed in such a way to directly supply a gas containing carbons, and a catalyst metal into a reaction furnace and react them without using any substrate, and the carbon nanotubes can be mass-produced, while providing a high economic efficiency. In the aforementioned vapor synthesis method, the use of a catalyst metal is essential, and Ni, Co or Fe is most used as a catalyst metal. Each catalyst metal particle may function as one seed to form a carbon nanotube.

Meanwhile, as a prior art document which describes a carbon nanotube and a catalyst for producing the same, there are the Korean patent laid-open No. 2010/0042765 entitled "a loading catalyst for a carbon nanotube synthesis, a method for producing the same, and a carbon nanotube using the same", and the Korean patent laid-open No. 2012/0093458 entitled "a high conductive carbon nanotube having a vertical orientation bundle structure and a high conductive polymer nano-composite composition using the same", both of which disclose a crushed spherical catalyst and a sheet type catalyst, but they still have a problem since it is impossible to economically mass-produce a high quality carbon nanotube having the natural good characteristics of the carbon nanotubes.

More specifically, the specific surface area of the catalyst is not wide, so the production amount of the carbon nanotubes are not lots as compared to the used amount of the catalyst, and the surface area of the produced carbon nanotube is not wide, and the quality is not even. For these reasons, the aforementioned carbon nanotubes are not good to be used for the sake of various potential applications wherein the natural good characteristics of the carbon nanotubes can be revealed.

SUMMARY OF THE DISCLOSURE

Technical Problem

The present invention has been made in an effort to solve the above-described problems. It is an object of the present invention to provide a technology for producing a wide specific surface area catalyst wherein the value obtained by dividing the volume of a carbon nanotube grown per 1 g of a catalyst by the volume of 1 g is over 30 and a high quality multi-wall carbon nanotube (the diameter of each carbon nanotube is preferably 3~10 nm, and the number of the walls is 3~10) using the thusly produced catalyst wherein the high quality multi-wall carbon nanotube has a wide specific surface area, and in particular to a technology for mass-producing at a low cost a multi-wall carbon nanotube which has a significantly enhanced conductivity and dispersibility.

It, however, is noted that the objects which are intended to be achieved by the present invention are not limited to the aforementioned objects, and other objects which have not been mentioned above, will become apparent by a person having ordinary skill in the art from the following descriptions.

Solution to Problem

According to an aspect of the present invention, a multi-wall carbon nanotube is provided, wherein the value obtained by dividing the volume of a multi-wall carbon nanotube grown per 1 g of the catalyst expressed by the following formula (1) by the volume of 1 g of the catalyst is over 30.

$$V_{t/c}=(W_t\times\gamma_t)/(W_c\times\gamma_c) \qquad \text{Formula (1)}$$

(in the formula (1), $\gamma_t=1/\rho_t$, $\gamma_c=1/\rho_c$, and $W_t$ is the weight of the carbon nanotube which can be grown with the unit catalyst (1 g), and $W_c$ is 1 g which means the weight of the unit catalyst, and $P_t$ is the apparent density of the carbon nanotube, and $\rho_c$ is the apparent density of the catalyst).

According to another aspect of the present invention, a multi-wall carbon nanotube is provided, wherein the surface area is 400~1,000 m²/g. The surface area of the multi-wall carbon nanotube is, for example, 400~1,000 m²/g, and is preferably 500~1,000 m²/g, and is more preferably 600~1,000 m²/g, and the aforementioned values are not limited thereto.

According to further another aspect of the present invention, a composite formed of a multi-wall carbon nanotube may be provided. In particular, the aforementioned composite may include over 0.5% by weight of a multi-wall carbon nanotube. For this reason, the composite is able to have conductivity, and the matrix of the composite may be a polymer, a ceramic, a metal or a combination of them.

According to still further another aspect of the present invention, an energy storage device formed of a multi-wall carbon nanotube may be provided.

According to yet still further another aspect of the present invention, a plate type catalyst for a carbon nanotube growth is provided, wherein it contains one or more components selected from the group consisting of Fe, Co, Ca, Ni and Mo and contains one or more components selected from the group consisting of Mn, Al, Mg and Si, and it has a composition ratio which may be expressed by the chemical formula 1, and it has a 0.05~0.07 g/ml, and the value obtained by dividing the volume of the multi-wall carbon nanotube grown per 1 g of the catalyst expressed by the formula (2) by the volume of 1 g is over 30.

$$[Fe_a, Co_b, Ca_c, Ni_d, Mo_e][Mn_w, Al_x, Mg_y, Si_z] \quad \text{[Chemical formula 1]}$$

(in the aforementioned chemical formula (1), a, b, c, d, e, w, x, y and z mean the molar fractions of each element, and 0≤a≤10, 0≤b≤10, 0≤c≤10, 0≤d≤10, 0≤e≤10, 0≤w≤30, 0≤x≤30, 0≤y≤30, 0≤z≤30, and 2≤a+b+c+d+e+w+x+y+z≤170, 2≤a+b+c+d+e≤50, 2≤w+x+y+z≤50).

$$V_{t/c} = (W_t \times \gamma_t)/(W_c \times \gamma_c) \quad (2)$$

(in the aforementioned formula (2), $\gamma_t = 1/\rho_t$, $\gamma_c = 1/\rho_c$, and $W_t$ is the weight of the carbon nanotube which can be grown with the unit catalyst (1 g), and $W_c$ is 1 g which means the weight of the unit catalyst, and $\rho_t$ is the apparent density of the carbon nanotube, and $\rho_c$ is the apparent density of the catalyst).

According to yet still further another aspect of the present invention, a plate type catalyst for a carbon nanotube growth is provided, wherein the specific surface area is over 120 m²/g.

According to yet still further another object of the present invention, a carbon nanotube containing a plate type catalyst is provided. In case of a plate type catalyst, it has a surface area wider than that of a spherical or needle-shaped catalyst, and the carbon nanotube can be concurrently grown at the upper and lower surfaces of the catalyst.

According to yet still further another aspect of the present invention, a method for producing a plate type catalyst for the growth of a carbon nanotube is provided, which may include a mixing step (a) wherein one or more components selected from the reaction precursors formed of Fe, Co, Ca, Ni and Mo and one or more components selected from the reaction precursors formed of Mn, Al, Mg and Si are mixed, thus producing a mixture; and a step (b) wherein the mixture is plasticized while being sprayed in the form of liquid droplets at a temperature of 400~900° C.

Each surface of the plate type catalyst according to the present invention may be formed flat or may have a curved surface shape (a bent shape) having a predetermined curvature, but the aforementioned feature is not limited thereto.

Advantageous Effects

The plate type catalyst produced by a catalyst production method according to the present invention has a very low apparent density. More specifically, it has a much wider surface area as compared to its weight, and a dispersion energy can be used less if a carbon nanotube is synthesized using the aforementioned catalyst, and any damage to the length can be greatly reduced during the dispersion procedure, so a high conductivity can be provided.

In the multi-wall carbon nanotube synthesized using a catalyst produced by the production method of the present invention, it has a diameter which is similar to that of a single wall carbon nanotube (SWNT), and the number of the walls is 3~10, which means a high homogeneity. Since the specific surface area is very large, a high conductivity can be obtained.

Moreover, the carbon nanotube grown using the catalyst according to the present invention has a purity of over 98%, by which more than a couple of times of the multi-wall carbon nanotubes can be synthesized even using the same amount of catalyst as compared to the conventional method.

DETAILED DESCRIPTION

The implementations and embodiments of the present invention will be described in detail with reference to the accompanying drawings so that a person having ordinary skill in the art can easily implement the present invention. It, however, it noted that the present invention may be implemented into various different forms, which are not limited to the implementations and embodiments disclosed herein. Moreover, the portions which are not directly related with the descriptions of the present invention will be omitted for the sake of clarified descriptions of the present invention.

Throughout the specification of the present invention, unless otherwise stated herein, the term "comprise" may represent that another component may be further included, not excluding the aforementioned another component.

The term "approximate" used throughout the specification may be used to represent that a thing is close at a predetermined value or to the value if a predetermined tolerance is suggested for an inherent manufacturing and substance and may be used to prevent the disclosure, which contains an accurate or absolute value provided to assist the better understanding of the present invention, from being unfairly used by an unconscious person. Moreover, the terms "a step of ~ing" or "a step of ~" used throughout the specification should not interpreted as representing "a step for ~ing".

The implementations and embodiments of the present invention will be described with reference to the accompanying drawings, and it is obvious that the present invention is not limited to such implementations and embodiments.

According to an aspect of the present invention, a multi-wall carbon nanotube is provided, wherein the value obtained by dividing the volume of a multi-wall carbon nanotube grown per 1 g of the catalyst expressed by the following formula (1) by the volume of 1 g of the catalyst is over 30.

$$V_{t/c} = (W_t \times \gamma_t)/(W_c \times \gamma_c) \quad \text{Formula (1)}$$

(in the formula 1, $\gamma_t = 1/\rho_t$, $\gamma_c = 1/\rho_c$, and $W_t$ is the weight of the carbon nanotube which can be grown with the unit catalyst (1 g), and $W_c$ is 1 g which means the weight of the unit catalyst, and $\rho_t$ is the apparent density of the carbon nanotube, and $\rho_c$ is the apparent density of the catalyst).

According to another aspect of the present invention, a multi-wall carbon nanotube is provided, wherein the surface area is 400~1,000 m²/g. The surface area of the multi-wall carbon nanotube is, for example, 400~1,000 m²/g, and is preferably 500~1,000 m²/g, and is more preferably 600~1, 000 m²/g, and the aforementioned values are not limited thereto. The aforementioned surface area is a wide surface area which has not been ever observed at the multi-wall carbon nanotube, except for the single wall carbon nanotube (SWNT). This surface area is available since the carbon nanotube grown using the catalyst of the present invention has a multi-wall structure wherein the number of walls is less, and the diameter of the carbon nanotube is small.

An implementation of the present invention is characterized in that the diameter of the multi-wall carbon nanotube is 3~10 nm, and the number of the walls is 3~10, but the aforementioned features are not limited thereto. For example, the diameter of the multi-wall nanotube may be 3~10 nm, and may be preferably 3~6 nm and may be more preferably 3~5 nm, and the number of the multi-wall nanotubes may be, for example, 3~10 and may be preferably 3~6 and may be more preferably 3~5.

According to an implementation of the present invention, the purity of the multi-wall carbon nanotube is, for example, over 98%, but it is not limited thereto.

According to another aspect of the present invention, a composite formed of a multi-wall carbon nanotube is provided, wherein the composite contains more than 0.5% by weight of the multi-wall carbon nanotube. For this reason, it may have a conductivity, and the matrix of the composite may be any of a polymer, a ceramic, a metal and a combination of them. The aforementioned polymer may be any of a thermoplastic polymer and a thermosetting polymer, but it is not limited thereto.

The thermoplastic resin is a plasticity or transmutability polymer material. The thermoplastic resin can be dissolved into liquid, and can be remolded even after it has been hardened. For example, the thermoplastic resin may be any of an acrylic resin, a polyvinyl chloride resin, a polyvinyl acetate resin, a vinyl acetyl resin, a methylmethacrylic resin, a styrene resin, a polypropylene resin, a polyethylene resin, and a polyamide resin (nylon), but it is not limited thereto.

The thermosetting resin is a polymer material which can be more hardened when a predetermined energy is supplied to the thermosetting resin. Once the thermosetting resin is hardened, it no longer can be heated or molded. For example, the thermosetting resin may be any of a phenol resin, a urea resin, a melamine resin, a unsaturated polyester resin, an epoxy resin, a polyurethane resin, a polyamide resin, an alkyd resin and a silicon resin, but it is not limited thereto.

As for the electric conductivity of a carbon nanotube conductive composite, an electrical percolation, in general, may occur at the content of about 1~2% by weight in case of a multi-wall carbon nanotube. The multi-wall carbon nanotube according to the present invention is able to have a conductivity even at 0.5% by weight which corresponds to a very low concentration. The conductive composite using the present invention may be applied, for example, to a bulk type composite, a thin film type composite, an energy sector and an electric electronic sector. More specifically, the conductive composite of the present invention may be applied, for example, to a plastic for an electronic device antistatic and static electricity distribution, a plastic which has the functions of an electromagnetic wave shielding and a heat radiation, a conductive transparent electrode used at an OLED and a solar battery, a lithium ion battery additive, and a carbon nanotube composite for a concrete enforcement and heat radiation, but it is not limited thereto.

According to another aspect of the present invention, an energy storage device formed of a multi-wall carbon nanotube is provided. The carbon material containing a multi-wall carbon nanotube is a very important substance which has effect on the performance of such an energy storage device. The energy storage device using the same may be any of a primary cell, a secondary cell, a super-capacitor, a fuel cell, and a solar battery, but it is not limited thereto.

According to another aspect of the present invention, a plate type catalyst for the growth of a carbon nanotube is provided, wherein it may contain one or more components (preferably, two or more components) selected from the group consisting of Fe, Co, Ca, Ni and Mo, and it may contain one or more components (preferably two or more components) selected from the group consisting of Mn, Al, Mg and Si, and it may has a composition ratio which can be expressed by the following chemical formula (1), and the apparent density is 0.05~0.07 g/ml, and the value obtained by dividing the volume of the multi-wall carbon nanotube grown per 1 g of the catalyst which can be expressed by the following formula (2), by the volume of 1 g of the catalyst is over 30.

$$[Fe_a, Co_b, Ca_c, Ni_d, Mo_e][Mn_w, Al_x, Mg_y, Si_z]$$
[Chemical formula 1]

(in the aforementioned chemical formula (1), a, b, c, d, e, w, x, y and z mean the molar fractions of each element, and $0 \leq a \leq 10$, $0 \leq b \leq 10$, $0 \leq c \leq 10$, $0 \leq d \leq 10$, $0 \leq e \leq 10$, $0 \leq w \leq 30$, $0 \leq x \leq 30$, $0 \leq y \leq 30$, $0 \leq z \leq 30$, and $2 \leq a+b+c+d+e+w+x+y+z \leq 170$, $2 \leq a+b+c+d+e \leq 50$, $2 \leq w+x+y+z \leq 50$).

$$V_{t/c} = (W_t \times \gamma_t)/(W_c \times \gamma_c) \quad (2)$$

(in the aforementioned formula (2), $\gamma_t = 1/\rho_t$, $\gamma_c = 1/\rho_c$, and
$W_t$ is the weight of the carbon nanotube which can be grown with the unit catalyst (1 g), and
$W_c$ is 1 g which means the weight of the unit catalyst, and
$\rho_t$ is the apparent density of the carbon nanotube, and $\rho_c$ is the apparent density of the catalyst).

In an implementation of the present invention, the catalyst, for example, may be any one selected from the group consisting of Iron(II) chloride tetrahydrate, Iron(II) sulfate heptahydrate, Iron(III) chloride anhydrous, Iron(III) nitrate nonahydrate, Ammonium iron(III) sulfate dodecahydrate (all of which contain a Fe component), Cobalt(II) acetate tetrahydrate, Cobalt(II) chloride hexahydrate, Cobalt(II) nitrate hexahydrate, Cobalt(II) sulfate heptahydrate (all of which contain a Co component), Calcium acetate monohydrate, Calcium chloride anhydrous, Calcium nitrate tetrahydrate, Calcium sulfate dihydrate (all of which contain a Ca component), Nickel(II) chloride hexahydrate, Nickel(II) nitrate hexahydrate, Nickel(II) sulfate hexahydrate, Ammonium molybdate tetrahydrate (all of which contain a Ni component), Manganese(II) acetate tetrahydrate, Manganese(II) chloride tetrahydrate, Manganese(II) nitrate hexahydrate, Manganese(II) sulfate monohydrate (all of which contain a Mn component), Aluminium chloride hexahydrate, Aluminium hydroxide, Aluminium isopropoxide, Aluminium nitrate nonahydrate (all of which contain an Al component), Magnesium acetate tetrahydrate, Magnesium chloride hexahydrate, Magnesium hydroxide, Magnesium nitrate hexahydrate, Magnesium sulfate anhydrous (all of which contain a Mg component), Silicon dioxide, Silicon carbide, Silicon, Silicon(IV) chloride (all of which contain a Si component) and a combination of them, but it is not limited thereto.

According to another aspect of the present invention, a plate type catalyst for the growth of a carbon nanotube the specific surface area of which is over 120 m²/g is provided. The carbon nanotube the specific surface area of which is wide can be mass-produced in such a way to increase an active reaction surface area by using a plate type catalyst for the growth of a carbon nanotube wherein the value obtained by dividing the volume of a multi-wall carbon nanotube grown per 1 g of the catalyst, by the volume of 1 g of the catalyst is over 30. The carbon nanotube synthesized by using the catalyst the specific surface area of which is wide according to the present invention, so the carbon nanotube can have a low dispersion energy and a high conductivity.

According to another aspect of the present invention, a carbon nanotube containing a plate type catalyst is provided. In case of the plate type catalyst, it has a wider surface area than that of a spherical or needle-shaped type catalyst, and the carbon nanotube can concurrently grow on the upper and lower surfaces of the catalyst, whereupon it is advantageously possible to enhance the productivity of the carbon nanotubes.

According to another aspect of the present invention, a method for a plate type catalyst for the growth of a carbon nanotube, which may include a mixing step (a) wherein one or more components selected from the reaction precursors formed of Fe, Co, Ca, Ni and Mo and one or more components selected from the reaction precursors formed of Mn, Al, Mg and Si are mixed, thus producing a mixture; and a step (b) wherein the mixture is plasticized while being sprayed in the form of liquid droplets at a temperature of 400~900° C. The step (b) is carried out following the step (a). The range of a high temperature at which the mixture is sprayed in the form of liquid droplets is, for example, 400~900° C., it is preferably 400~700° C., and it is more preferably 400~500° C.

The present invention will be described in detail below in conjunction with the embodiments, and it is noted that the present invention is not limited thereby.

Production Example 1

A carbon nanotube was produced using the catalyst obtained in the embodiment 1 based on the vapor deposition method wherein the temperature of a reactor was increased to 400~1200° C. under a carbon source gas and inert gas environment.

Production Example 2

A carbon nanotube was produced using the catalyst obtained in the embodiment 2 based on the vapor deposition method wherein the temperature of the reactor was increased to 400~1200° C. under a carbon source gas and inert gas environment.

The reactor used to produce the carbon nanotubes in the production examples 1 and 2 was, for example, any of a batch reactor, a fluidized bed type reactor, a rotary Kilin reactor, and the fluidized bed type reactor might be a roof type fluidized bed reactor, but it was not limited thereto.

The plate type catalyst containing the particles the specific surface areas of which were maximized, was produced based on the embodiments 1 and 2.

Figure 1:
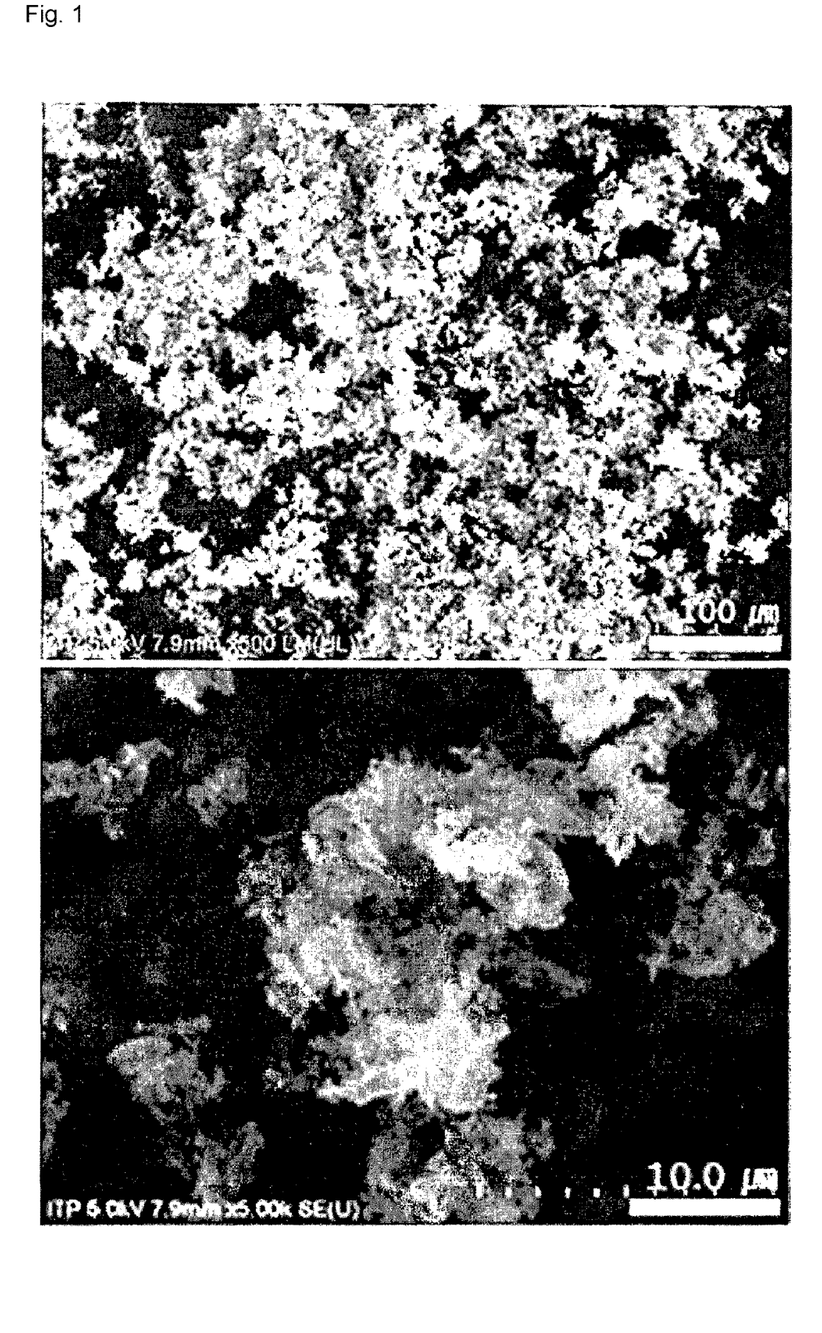
FIG. 1 is an image showing a catalyst taken by a scanning electron microscope (SEM), which is produced according to a first embodiment of the present invention.

FIG. 1 is an image showing the catalyst produced based on the embodiment 1, wherein the image was taken by the SEM. A result of the BET (Brunauer Emmett Teller) specific surface area measurement was 142 m$^2$/g, and the apparent density of the catalyst was measured in compliance with the Korean Standard (KS M ISO 1306).

More specifically, when measuring the apparent density, a catalyst was inputted through the center of a cylinder type container from a portion which was not over 50 mm higher than the edge of the container the diameter of which was

| | Embodiments | | | | | | | | |
|---|---|---|---|---|---|---|---|---|---|
| | Metal catalyst | | | Carbon nanotube | | | | | |
| Classi-fication | Sum of moles of compound (group 1) $Fe_aCo_bCa_cNi_dMO_e =$ $a + b + c + d + e$ | Sum of moles of compound (group2) $Mn_wAl_xMg_ySi_z =$ $w + x + y + z$ | Apparent density of catalyst (g/ml) KS M ISO 1306 | Synthesized amount(g) of carbon nanotubes per unit catalyst (1 g) | Apparent density (g/ml) KS M ISO 1306 | Diameter distribu-tion(nm) TEM | Purity(wt %) Ash content KS M ISO 1125 | Specific surface area(m$^2$/g) BET | Volume-weight ratio($V_{t/c}$) |
| Embodiment 1 | a + b = 5 | x + y = 16 | 0.05 | 90 | 0.01 | 5~8 | >98 | 600 | 450 |
| Embodiment 2 | a + b = 5 | x + y = 20 | 0.02 | 80 | 0.01 | 5~8 | >98 | 600 | 160 |

Embodiment 1

Mg(NO$_3$)$_2$.6H$_2$O and AlCl$_3$.6H$_2$O were added to 100 ml of water for the sum of moles of Al and Mg to be 16 and were agitated, and Fe(NO$_3$)$_2$.9H$_2$O and Co(NO$_3$)$_2$.6H$_2$O were added for the sum of moles of Fe and Co to be 5 and were agitated. Thereafter, the mixture was sprayed in the form of liquid droplets within a temperature range of 400~900° C. and then was plasticized, thus producing a catalyst.

Embodiment 2

The same producing method as the method described in conjunction with the embodiment 1 was used, and a metal catalyst was produced after changing the sum of moles of Al and Mg 20.

100±10 mm, and which was not equipped with any spout at a vertical wall at a predetermined height, and the container had a storing volume of 1,000 cm$^3$ when it was filled full. An excessive amount of the catalyst was used to form a conical shape which was higher than the edges of the container. The upper surface of the catalyst filled in the container was arranged flat using a straight edge or a paddle in a state that they were contacted with the edges of the container without leaving any space between them. The weight of the container including the catalyst was measured. The mass of the catalyst was determined based on the nearest weight of gram after the weight of the cylinder was subtracted.

The apparent densities of the catalysts produced by the embodiments 1 and 2 of the present invention were 0.05 g/ml and 0.02 g/ml.

The multi-wall carbon nanotubes of the production examples 1 and 2 were produced using the catalyst which was produced based on the embodiments 1 and 2. The amounts of the carbon nanotubes synthesized per 1 g of the catalyst were 90 g and 80 g.

The apparent densities (measured in compliance with the KS M ISO 1306) of the multi-wall carbon nanotubes synthesized based on the production examples 1 and 2 were 0.01 g/ml, and the diameters of the carbon nanotubes measured by the TEM were 5~8 nm.

The purity was over 98%, and the measurement of the purity was carried out in compliance with the Ash Content KS M ISO 1125.

More specifically, a crucible was heated in an electric furnace at a temperature of 550±25° C. for one hour with the lid close so as to measure the purity, and the crucible and the lid were inputted in a desiccator. It was cooled to a room temperature, and the weight was measured up to the weight unit of 0.1 mg. The carbon nanotube of slightly over 2 g was dried for one hour in a dryer of 125° C., and it was cooled to a room temperature and was inputted into the crucible which had been used when measuring the weight of the carbon nanotube, and the weight thereof was measured up to the weight unit of 0.1 mg, and it was heated in the electric furnace of 800±25° C. with the lid open for the same to become a predetermined amount. Subsequently, the lid was closed, and it was moved into the desiccator and was cooled to a room temperature, and the weight thereof was measured up to the weight unit of 0.1 mg. The crucible and the lid were washed and dried in the dryer of 125° C., and the weight thereof was measured again up to the weight unit of 0.1 mg.

The BET specific surface areas of the multi-wall carbon nanotubes synthesized by the production examples 1 and 2 were all 600 m²/g, and each volume-weight ratio ($V_{t/c}$) thereof was 450 and 160, respectively. In the multi-wall carbon nanotube produced by the production example 1, what the volume-weight ratio ($V_{t/c}$) of the carbon nanotube which had grown using the unit catalyst (1 g) was 450, represented that the volume of the multi-wall carbon nanotube grown as compared to the volume that 1 g of the catalyst had was 450 times.

More specifically, since the volume of 1 g of the unit catalyst was 20 ml, it meant that the volume of the multi-wall carbon nanotube which had grown using the plate type catalyst was 9,000 ml (9 Liter).

Figure 2:
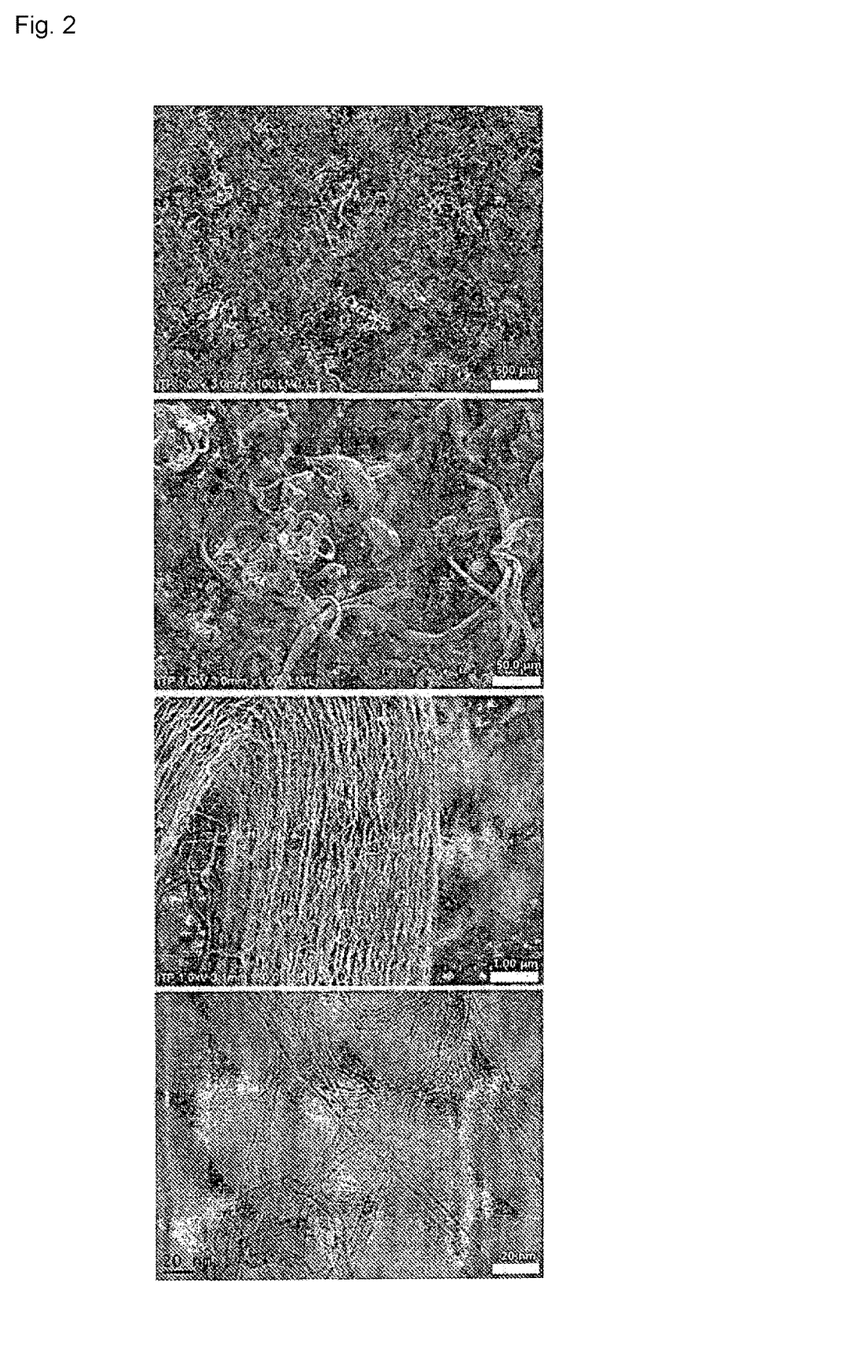
FIG. 2 is an image showing a multi-wall carbon nanotube taken by a SEM and a transmission electron microscope (TEM), which is produced according to a first embodiment of the present invention.
Figure 3:
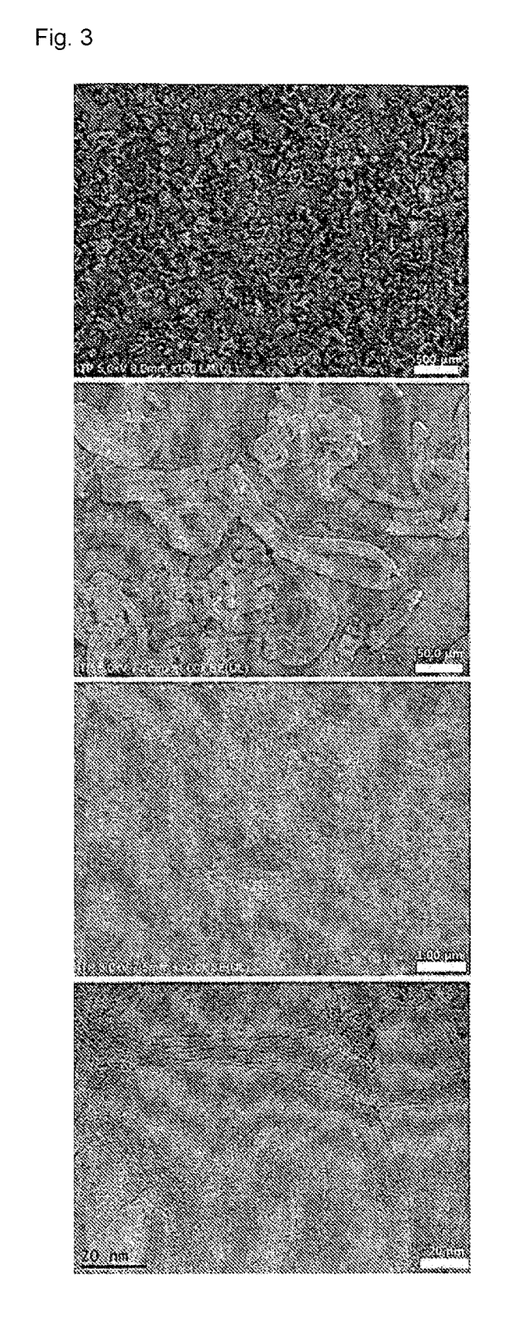
FIG. 3 is an image showing a multi-wall carbon nanotube taken by a SEM and a TEM, which is produced according to a second embodiment of the present invention.

FIGS. 2 and 3 are images showing the carbon nanotubes produced by the production examples 1 and 2 wherein the images were taken by the SEM and the TEM. As shown therein, it is possible to confirm the carbon nanotubes which were measured using the scale bars of 500 μm, 50 μm, 1 μm and 20 nm.

Figure 4:
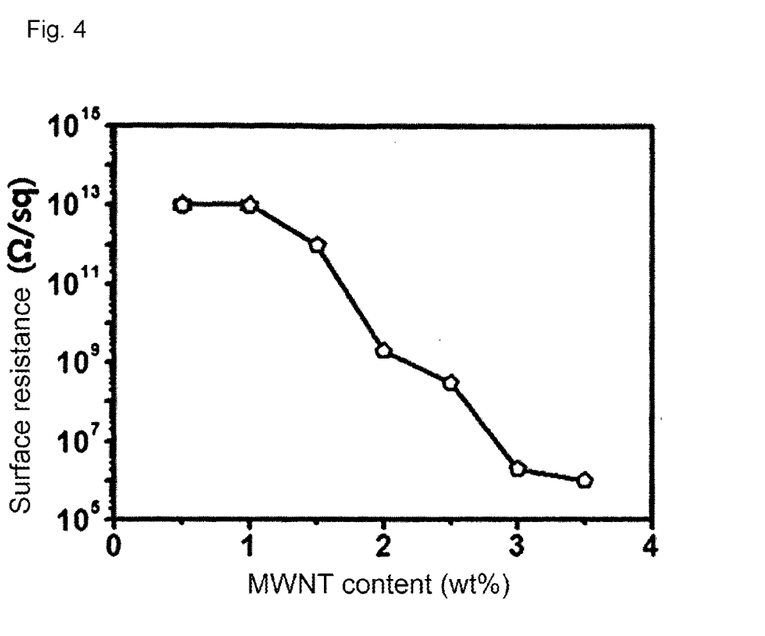
FIG. 4 is a graph showing a surface resistance based on the content of a multi-wall carbon nanotube (MWNT)

FIG. 4 is a graph showing the surface resistance of the composite based on the content of the multi-wall carbon nanotube (MWNT) which was grown using the catalyst of the present invention. The measurement was carried out to confirm conductivity. The nylon 66/MWNT composite was produced in such a way to differentiate the contents of the multi-wall carbon nanotubes produced using a twin screw extruder.

As illustrated in FIG. 4, the composite may have a conductivity from when it contains the content of 0.5% by weight of the multi-wall carbon nanotube (MWNT), and as the content of the multi-wall carbon nanotube increases, the conductivity of the composite sharply increases (whereas as the content of the multi-wall carbon nanotube increases, the surface resistance sharply decreases).

The multi-wall carbon nanotube which has a high dispersibility and is synthesized using the catalyst of the present invention, has a high conductivity in a polymer matrix and at a low content (0.5% by weight).

Figure 5:
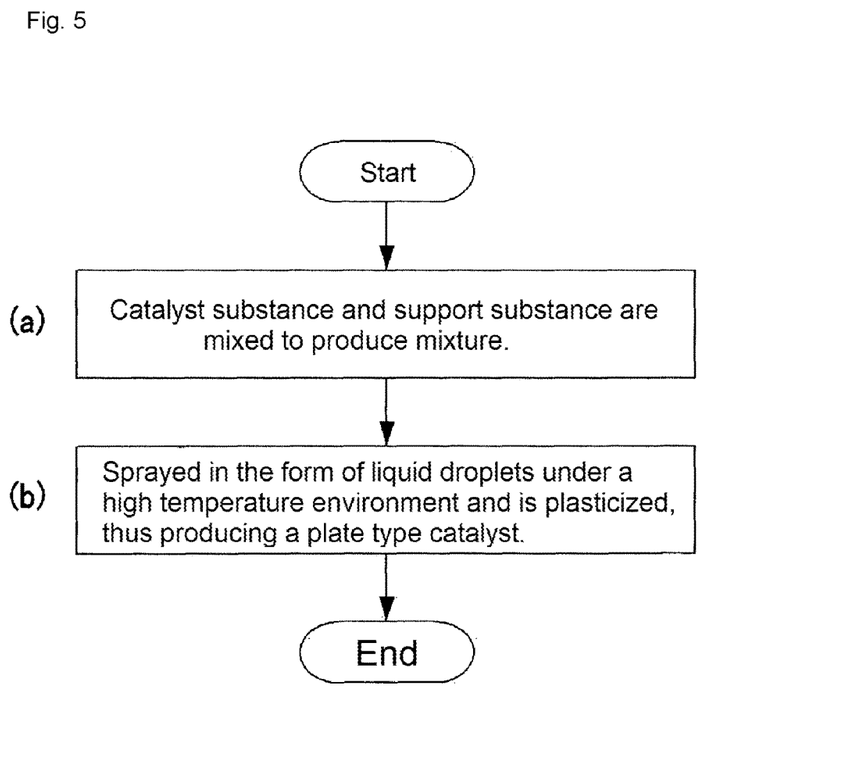
FIG. 5 is a schematic view for describing a method for producing a catalyst to synthesize a multi-wall carbon nanotube.

FIG. 5 is a schematic view for describing a method for producing a catalyst for the synthesis of a multi-wall carbon nanotube.

As described above, the catalyst (a plate type catalyst) produced by the catalyst production method according to the present invention has a very low apparent density. Since the surface area is very wide as compared to its weight, the production amount of the multi-wall carbon nanotube can be increased, and the multi-wall carbon nanotube synthesized using the aforementioned catalyst may need less dispersion energy and is able to maintain a high conductivity since the length may be damaged much less during the dispersion procedure.

Moreover, a high purity multi-wall carbon nanotube synthesized using the catalyst produced by the production method of the present invention has a diameter which is similar to that of a single wall carbon nanotube (SWNT). The number of walls is 3~10 which means a very even quality. Since the surface area is large, the multi-wall carbon nanotube according to the present invention has a very high conductivity.

The above description of the present invention is provided for illustrative purposes, and it is understood that a person having ordinary skill in the art is able to easily modify it into various forms without changing the technical idea or necessary features of the present invention. For this reason, the disclosed embodiments are provided for illustrative purposes in all aspects, not limiting to the disclosures.

The scope of the present invention may be determined by the subsequent claims rather than the descriptions, and it is noted that all changes or modifications derived from the meaning and scope and equivalents of the present invention are included in the scope of the present invention.

What is claimed is:

1. A multi-wall carbon nanotube wherein the value obtained by dividing the volume of a carbon nanotube grown per 1 g of the catalyst expressed by the following formula (1), by the volume of 1 g of the catalyst is over 120, wherein $$V_{t/c}=(W_t \times \gamma_t)/(W_c \times \gamma_c) \qquad \text{Formula (1)}$$

(in the formula (1), $\gamma_t=1/\rho_t$, $\gamma_c=1/\rho_c$, and
$W_t$ is the weight of the carbon nanotube which can be grown with the unit catalyst (1 g), and
$W_c$ is 1 g which means the weight of the unit catalyst, and
$\rho_t$ is the apparent density of the carbon nanotube, and $\rho_c$ is the apparent density of the catalyst),
wherein the surface area of the multi-wall carbon nanotube is 400-1,000 m²/g.

2. The multi-wall carbon nanotube of claim 1 wherein the diameter of the multi-wall carbon nanotube is 3-10 nm, and the number of walls is 3-10.

3. The multi-wall carbon nanotube of claim 1 wherein the purity of the multi-wall carbon nanotube is over 98%.

4. The multi-wall carbon nanotube of claim 1, wherein the value obtained by dividing the volume of the carbon nanotube grown per 1 g of the catalyst expressed by formula (1), by the volume of 1 g of the catalyst is over 160.

5. A composite that includes a multi-wall carbon nanotube of claim 1.

6. An energy storage device formed of a multi-wall carbon nanotube of claim 1.

* * * * *